US011948912B2

(12) United States Patent
Sigl et al.

(10) Patent No.: US 11,948,912 B2
(45) Date of Patent: *Apr. 2, 2024

(54) METHOD OF MANUFACTURING A BONDED SUBSTRATE STACK BY SURFACE ACTIVATION

(71) Applicant: Infineon Technologies AG, Neubiberg (DE)

(72) Inventors: Alfred Sigl, Sinzing (DE); Alexander Frey, Lappersdorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/104,456

(22) Filed: Feb. 1, 2023

(65) Prior Publication Data

US 2023/0178512 A1     Jun. 8, 2023

Related U.S. Application Data

(63) Continuation of application No. 17/518,000, filed on Nov. 3, 2021, now Pat. No. 11,594,515.

(30) Foreign Application Priority Data

Nov. 3, 2020    (EP) ..................................... 20205462

(51) Int. Cl.
*H01L 23/00*    (2006.01)
*H01L 21/18*    (2006.01)
*H01L 25/065*   (2023.01)

(52) U.S. Cl.
CPC ............ *H01L 24/94* (2013.01); *H01L 21/187* (2013.01); *H01L 25/0652* (2013.01)

(58) Field of Classification Search
CPC ....... H01L 21/187; H01L 24/08; H01L 24/80; H01L 24/94; H01L 25/0652
See application file for complete search history.

(56) References Cited

U.S. PATENT DOCUMENTS

| 11,594,515 B2* | 2/2023 | Sigl ..................... H01L 25/0652 |
| 2015/0048523 A1 | 2/2015 | Suga et al. |
| 2017/0033071 A1 | 2/2017 | Ichikawa |
| 2017/0047225 A1 | 2/2017 | Suga et al. |
| 2017/0221856 A1 | 8/2017 | Yamauchi |

(Continued)

FOREIGN PATENT DOCUMENTS

WO    2019126769 A1    6/2019

*Primary Examiner* — Brook Kebede
(74) *Attorney, Agent, or Firm* — Murphy, Bilak & Homiller, PLLC

(57) ABSTRACT

A method of manufacturing a bonded substrate stack includes: providing a first substrate having a first hybrid interface layer, the first hybrid interface layer including a first insulator and a first metal; and providing a second substrate having a second hybrid interface layer, the second hybrid interface layer including a second insulator and a second metal. The hybrid interface layers are surface-activated to generate dangling bonds on the hybrid interface layers. The surface-activated hybrid interface layers are brought into contact, such that the dangling bonds of the first hybrid interface layer and the dangling bonds of the second hybrid interface layer bond together to form first insulator to second insulator bonds and first metal to second metal bonds.

19 Claims, 2 Drawing Sheets

(56) References Cited

U.S. PATENT DOCUMENTS

| | | | |
|---|---|---|---|
| 2018/0226371 A1* | 8/2018 | Enquist | H01L 25/50 |
| 2021/0296282 A1 | 9/2021 | Gao et al. | |
| 2021/0305202 A1* | 9/2021 | Uzoh | H01L 24/80 |
| 2021/0407941 A1* | 12/2021 | Haba | H01L 23/3121 |

* cited by examiner

METHOD OF MANUFACTURING A BONDED SUBSTRATE STACK BY SURFACE ACTIVATION

TECHNICAL FIELD

This disclosure relates to the field of substrate bonding, and in particular to the technique of manufacturing a bonded substrate stack.

BACKGROUND

A variety of techniques are available for substrate or wafer bonding, among them silicon direct bonding, high temperature bonding, low temperature plasma-activated bonding, etc. Further, it is known that a post anneal process may strengthen a bond generated between substrates or wafers.

Hybrid bonding is a technique used for bonding surfaces which comprise metal electrodes and insulator areas. Hybrid wafer bonding has been used with low temperature plasma-activated bonding and annealing at about 250° C. to 300° C. for manufacturing of hybrid interfaces composed of $SiO_2$—$SiO_2$, $Si_3N_4$—$Si_3N_4$, $SiO_xN_y$—$SiO_xN_y$ or $SiC_xN_y$—$SiC_xN_y$ insulators and Cu—Cu or W—W electrodes.

Hybrid bonding in combination with low temperature plasma-activated bonding is, however, limited to specific interface materials ($SiO_2$, $Si_3N_4$, $SiO_xN_y$, or $SiC_xN_y$ insulators and Cu or W electrodes), has to observe specific density rules for the metal and further imposes restrictions on the selection of different substrates due to CTE (coefficient of thermal expansion) mismatch during anneal.

Hence, hybrid substrate bonding is an ongoing challenge for progressing to highly versatile 3D (three-dimensional) devices.

SUMMARY

According to an aspect of the disclosure a method of manufacturing a bonded substrate stack is described. The method comprises providing a first substrate having a first hybrid interface layer, the first hybrid interface layer comprising a first insulator and a first metal. The method further comprises providing a second substrate having a second hybrid interface layer, the second hybrid interface layer comprising a second insulator and a second metal. The first hybrid interface layer and the second hybrid interface layer are surface-activated by particle bombardment. The particle bombardment is configured to remove atoms of the first hybrid interface layer and atoms of the second hybrid interface layer to generate dangling bonds on the first hybrid interface layer and on the second hybrid interface layer. The surface-activated first hybrid interface layer and the surface-activated second hybrid interface layer are brought into contact, thereby causing the dangling bonds of the first hybrid interface layer and the dangling bonds of the second hybrid interface layer to bond together to form the first insulator to second insulator bonds and/or the first metal to second metal bonds.

According to another aspect of the disclosure a substrate stack comprises a first substrate having a first hybrid interface layer, the first hybrid interface layer comprising a first insulator and a first metal. The substrate stack further comprises a second substrate having a second hybrid interface layer, the second hybrid interface layer comprising a second insulator and a second metal. The first hybrid interface layer is bonded to the second hybrid interface layer by surface-activated bonding featuring first insulator to second insulator bonds and first metal to second metal bonds. Herein, surface activated bonding comprises surface-activating the first hybrid interface layer and the second hybrid interface layer by particle bombardment configured to remove atoms of the first hybrid interface layer and atoms of the second hybrid interface layer to generate dangling bonds on the first hybrid interface layer and on the second hybrid interface layer. The surface-activated first hybrid interface layer and the surface-activated second hybrid interface layer are brought into contact, thereby causing the dangling bonds of the first hybrid interface layer and the dangling bonds of the second hybrid interface layer to bond together to form the first insulator to second insulator bonds and/or the first metal to second metal bonds.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

DETAILED DESCRIPTION

As used in this specification, layers or elements illustrated as adjacent layers or elements do not necessarily be directly contacted together; intervening elements or layers may be provided between such layers or elements. However, in accordance with the disclosure, elements or layers illustrated as adjacent layers or elements may in particular be directly contacted together, i.e. no intervening elements or layers are provided between these layers or elements, respectively.

The words "over" or "beneath" with regard to a part, element or material layer formed or located or disposed or arranged or placed "over" or "beneath" a surface may be used herein to mean that the part, element or material layer be located (e.g. placed, formed, arranged, disposed, placed, etc.) "directly on" or "directly under", e.g. in direct contact with, the implied surface. The word "over" or "beneath" used with regard to a part, element or material layer formed or located or disposed or arranged or placed "over" or "beneath" a surface may, however, either be used herein to mean that the part, element or material layer be located (e.g. placed, formed, arranged, deposited, etc.) "indirectly on" or "indirectly under" the implied surface, with one or more additional parts, elements or layers being arranged between the implied surface and the part, element or material layer.

Figure 1A:
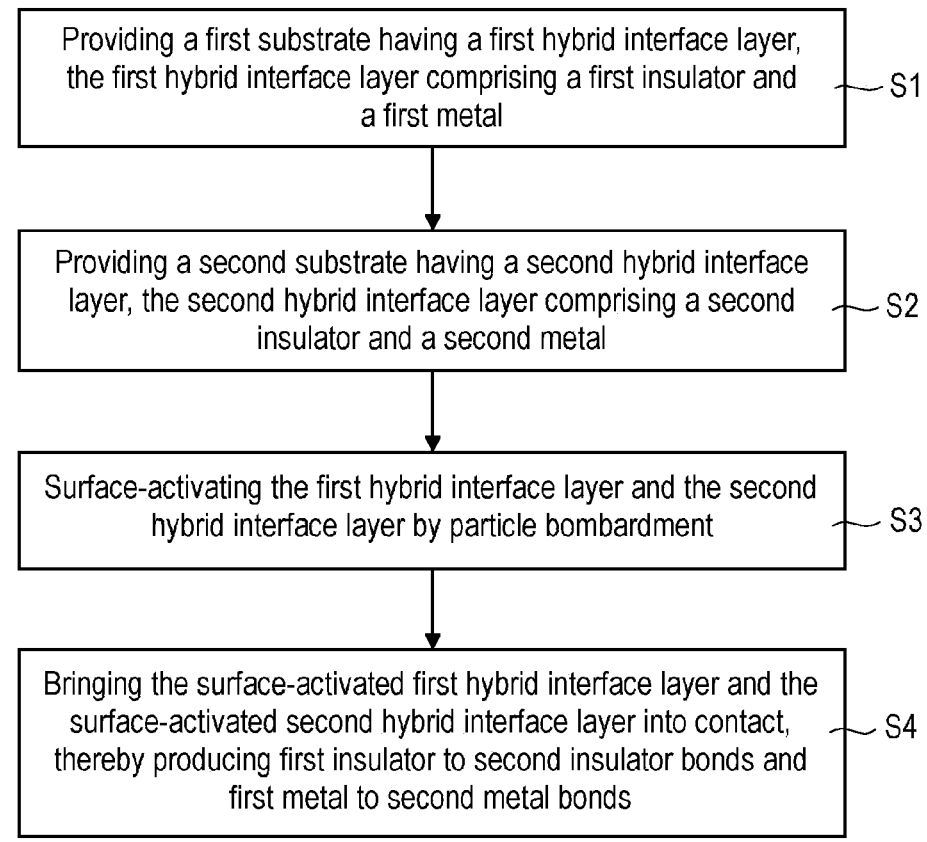
FIG. 1A is a flowchart illustrating an exemplary method of manufacturing a bonded substrate stack.

FIG. 1A illustrates stages of an exemplary method of manufacturing a bonded substrate stack. At S1 a first substrate having a first hybrid interface layer is provided. The first hybrid interface layer comprises a first insulator and a first metal.

At S2 a second substrate having a second hybrid interface layer is provided. The second hybrid interface layer comprises a second insulator and a second metal.

As will be explained in more detail further below, the first substrate and the second substrate may be of the same material or of different materials. Further, the first insulator and the second insulator may be of the same material or of different materials. Similarly, the first metal and the second metal may be of the same metal or may be of different metals. Here and in the following the term metal includes the metal chemical elements and metal alloys.

The metal-insulator pattern of the first and second hybrid interfaces may be identical. In other words, the geometrical distribution of metal and insulator over the first and second hybrid interfaces may be identical.

At S3 the first hybrid interface layer and the second hybrid interface layer are surface-activated by particle bombardment. At this stage of the process the first and second hybrid surfaces are cleaned. This cleaning step generates dangling bonds on the first and second hybrid interface layers.

At S4 the surface-activated first hybrid interface layer and the surface-activated second hybrid interface layer are brought into contact. Thereby, first insulator to second insulator bonds and first metal to second metal bonds are produced. The dangling bonds produced at S3 are effective in providing these bonds.

As apparent from FIG. 1A, the disclosure combines hybrid bonding and surface-activated bonding (SAB). Hybrid bonding relies on bonding metal-and-insulator hybrid interfaces. The SAB method allows to bond the first and second insulators and the first and second metals at the same time. Since the SAB method can be carried out at ambient temperature (i.e. room temperature), this technique allows to combine materials (e.g. first and second substrates and/or first and second metals and/or first and second insulators) which cannot be bonded if an annealing step would be necessary due to CTE (coefficient of thermal expansion) mismatch.

Hybrid wafer bonding is a technique which is conventionally used in combination with low temperature plasma-activated bonding. Low temperature plasma-activated bonding is limited to $SiO_2$—$SiO_2$, $Si_3N_4$—$Si_3N_4$, $SiO_xN_y$—$SiO_xN_y$ or $SiC_xN_y$—$SiC_xN_y$ bonding in combination with Cu to Cu bonding or W to W bonding. Further, as known in the art, hybrid wafer bonding with low temperature plasma-activated bonding imposes specific restrictions for the density and the pattern of the metal in the hybrid interface. More specifically, the percentage of metal area to the overall area of the hybrid interface needs to be less than about 5%. Further, the metal pattern needs to be evenly distributed across the hybrid interface.

Another restriction encountered in hybrid wafer bonding with low temperature plasma-activated bonding is that the metal areas (i.e. metal electrodes) need to be recessed by about 2-3 nm relative to the insulator areas in the hybrid interface. The reason for that is that the conventional low temperature plasma-activated bonding process is a two-stage process. In a first stage the wafers are brought into contact with each other and an insulator pre-bond is formed. In a second stage, during a 250° C.-300° C. anneal, the insulator to insulator bond reaches its final strength and the metal to metal bond is formed by an expansion of the metal electrodes to get in touch with each other. This happens at the same time and needs to be well tuned to each other. If during anneal the metal expands too much while the bond strength has not risen enough, the bond separates. Therefore, this two stage process relying on simultaneous insulator bond formation and metal expansion is subjected to the above-stated restrictions in view of metal recessing, metal patterning and maximum metal density.

These and other limitations become no longer necessary when hybrid bonding is combined with SAB as disclosed herein. The metal areas and insulator areas in both hybrid interface layers are at the same level, i.e. no metal recess is applied. Further, there is virtually no limitation of patterning of the first and second hybrid interface layers in terms of the geometrical distribution of metal and insulator areas. Hence, it is possible to bond large metal areas and/or fine metal lines together. Differently put, the metal areas can have a longitudinal shape allowing to bond metal lines or metal traces together. Further, the density rules known from low temperature plasma-activated bonding do not apply to hybrid bonding combined with SAB. Differently put, a ratio of metal area to insulator area of the first hybrid interface layer and/or of the second hybrid interface layer may, e.g., be equal to or greater than ⅒ or ⅕ or 1 or even 5. Of course, small metal area percentages such as represented by a ratio smaller than ⅒ are also possible.

Further, with hybrid bonding by SAB virtually any insulator material in combination with any metal material of the hybrid interface layers can be used. For instance, the first metal and/or the second metal may be selected from the group consisting of Cu, Pt, Ti, TiN, Al, AlCu, MO, Ag, Au, W, etc. Further, mixed metal bonds can be generated, that is the first metal may be different from the second metal.

Similar considerations apply to the selection of the insulators. The first insulator and/or the second insulator can be selected from the group consisting of, e.g., ceramics, $SiO_2$, SiN, $Al_2O_3$, AlN, AlScN, silicon oxynitride (SiON), borophosphosilicate glass (BPSG), GaN, InGaN, AlGaN, AlInGaN, GaAs, InGaAs, AlGaAs, AlInGaAs, GaP, InGaP, AlGaP, AlInGaP, polymer (e.g. benzocyclobutene (BCB), polyimide). Hybrid bonding by SAB further allows to bond a first insulator to a second insulator where the first insulator is different from the second insulator.

Further, substrates with different CTE can be bonded on each other because no annealing step is necessary like with hybrid bonding by low temperature plasma-activated bonding.

In one specific example, the first insulator is $SiO_2$ and the first metal is Cu while the second insulator is SiN and the second metal is Al.

Figure 1B:
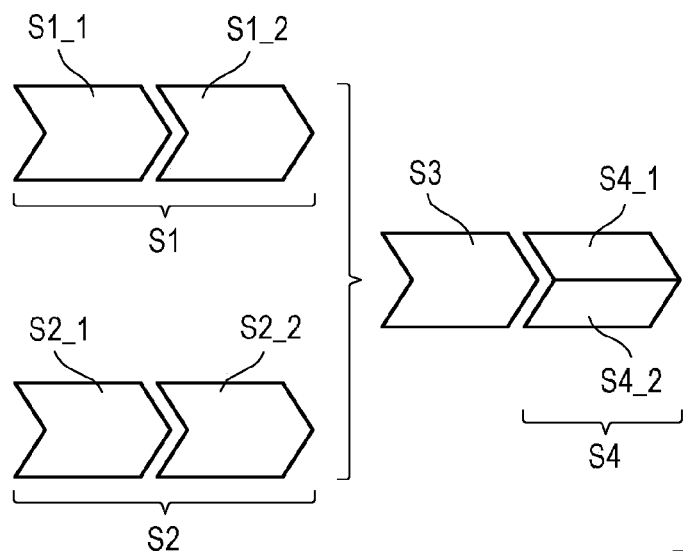
FIG. 1B is a flowchart illustrating exemplary processes of the method of manufacturing a bonded substrate stack of FIG. 1A.

FIG. 1B is a flowchart illustrating exemplary process stages of the method of manufacturing a bonded substrate stack of FIG. 1A. As shown in FIG. 1B, S1 may comprise the processes of fabricating the first hybrid interface layer containing first metal areas and first insulator areas at S1_1. By way of example, the first metal areas may be fabricated by lithography and electroplating. The first insulator areas filling the space between the first metal areas may then be fabricated by conventional deposition processes such as, e.g., chemical vapor deposition (CVD) or sputtering. In one example, the insulator may completely cover the surface of the substrate, in particular the first metal areas generated before.

At S1_2 the first hybrid interface layer is prepared by leveling the first hybrid interface layer to a roughness of equal to or less than 1 nm or 0.5 nm root mean square (RMS). This small roughness (or high degree of smoothness) relates to the entire first hybrid interface layer composed of the first insulator areas and the first metal areas, e.g.

to the entire wafer. That is, the first metal areas are flush with (i.e. neither recessed nor elevated compared to) the first insulator areas of the first hybrid interface layer.

The leveling process at S1_2 may be carried out by chemical-mechanical polishing (CMP). The CMP process may be used both to expose the first metal areas within the first insulator and to generate the first hybrid interface layer with a roughness as small as possible (or highest possible flatness).

Another process which can be used at stages S1_1 and S1_2 is called dual damascene process. In this process, first the insulator is deposited and a structure is etched into the insulator. Then, the metal is deposited in/on the structured insulator and the metal between the etched structures is removed by CMP. Hence, the metal only remains in the etched structures, and again the CMP is used to obtain the small roughness as mentioned above.

At S2 analogous processes S2_1 and S2_2 may be carried out for preparing the second hybrid interface layer. Reference is made to the above description in order to avoid reiteration. As the second metal may (optionally) be different from the first metal and/or the second insulator may (optionally) be different from the first insulator, the processes S2_1 and S2_2 may (optionally) be different from S1_1 and S1_2, respectively, so as to be adapted to the different materials used.

Surface-activation of the hybrid interface layers at S3 may then be carried out by cleaning and physically affecting the surfaces of the first and second hybrid interface layers by particle bombardment. During this process, atoms of the first hybrid interface layer and atoms of the second hybrid interface layer are removed to generate dangling bonds at the surfaces of the first and second hybrid interface layers. The dangling bonds remain on these surfaces meaning that these surfaces (of the first and second hybrid interface layers) are activated.

This surface-activation may be carried out by using neutral particles for particle bombardment or by using charged particles for particle bombardment. Particle bombardment is configured to generate the dangling bonds and may change the morphology of the surface of the first and second hybrid interface layers. For instance, at least a monolayer of atoms may be removed from the surface of the first and second hybrid interface layers during and for the formation of the dangling bonds.

In one example, fast (neutral) atom bombardment (FAB) techniques such as, e.g., Ar atom bombardment may be used for this purpose. In other examples, ion bombardment techniques may be used for surface-activation. In both cases, the kinetic energy of the particles used in the particle bombardment may, e.g., be in a range between 3 keV and 10 keV and/or may be equal to or greater than 3 or 4 or 5 or 6 or 7 or 8 or 9 keV.

Surface-activation may be carried out in high vacuum or ultra-high vacuum. The first and second hybrid interface layers may be cleaned and activated simultaneously in the same vacuum chamber.

Other particles than Ar atoms or ions may also be used for bombardment of the first and second hybrid interface layers for surface activation. By way of example, other inert or noble gases such as Ne, Kr, Xe, Rn or energetic radiation such as, e.g., alpha radiation or neutron radiation may also be used for surface activation.

It is to be noted that the process of surface activation by particle bombardment as described herein is different from the process of plasma activation used during plasma activated hybrid bonding. In particular, the process of surface activation by particle bombardment, as described herein, does not involve plasma generation and/or the treatment of the first and second hybrid interface layers by plasma-generated ions. Further, the kinetic energy of plasma-generated ions used during plasma activated hybrid bonding is below 1 keV and thus smaller than the kinetic energy of the particles used during particle bombardment for surface activation as disclosed herein.

At S4 the first insulator to second insulator bonds and the first metal to second metal bonds are produced. At S4_1, according to a first example, the surface-activated first hybrid interface layer and the surface-activated second hybrid interface layer are brought into contact at high vacuum or ultra-high vacuum. The process S4_1 may be carried out in the same vacuum chamber as used for the surface-activating process at S3.

Alternatively, the surface-activated first hybrid interface layer and the surface-activated second hybrid interface layer may be brought into contact in an inert gas atmosphere at S4_2. The inert gas atmosphere may be at atmospheric pressure or rough vacuum.

In this description rough vacuum relates e.g. to a pressure range from ambient pressure to 1 mbar, high vacuum (HV) relates e.g. to a pressure range from 10-3 to 10-8 mbar and ultra-high vacuum (UHV) relates e.g. to a pressure range from 10-8 to 10-11 mbar.

It is to be noted that both processes S4_1 and S4_2 may comprise initially contacting together respective centers of the hybrid interface layers. This may be achieved by using specific chucks (i.e. holders for the first and second substrates) which are configured to establish the first contact between the opposing hybrid interface layers of the substrates at their centers. By way of example, one or both of the chucks may be equipped with a movable center element which is operable to push the respective substrate at its center position by a small distance in the axial direction towards the other substrate. By way of example, if the chucks are arranged one above the other in horizontal planes, the lower chuck may have a small central pin which can be displaced upwardly to elevate the center of the substrate placed on the lower chuck by a small distance. This may ensure that the first contact between the first and second hybrid interface layers is reliably obtained at their center points. In addition or alternatively, the upper chuck may be equipped with a small central pin which can be displaced downwardly.

Starting the process of bringing together the surface-activated first and second hybrid interface layers at their respective center points allows to establish the bond in a highly controllable manner by beginning at the center and then advancing in a radial outward direction. This technique of placing the first and second hybrid interface layers together minimizes the generation of distortions. Such distortions occur when the first points of contact between the first and second hybrid interface layers are randomly generated across the interface, leading to inhomogeneous strain in the bonded interface layer.

If the first and second hybrid interface layers are brought into contact in an inert gas atmosphere at S4_2, the inert gas may act as a cushion during the bonding process. This effect improves the controllability of the placement process and therefore may further improve the quality of the hybrid interface layer bond. In particular, the inert gas atmosphere may support the technique of establishing the bond between the first and second hybrid interface layers in a radially outward direction as described above.

Figure 2:
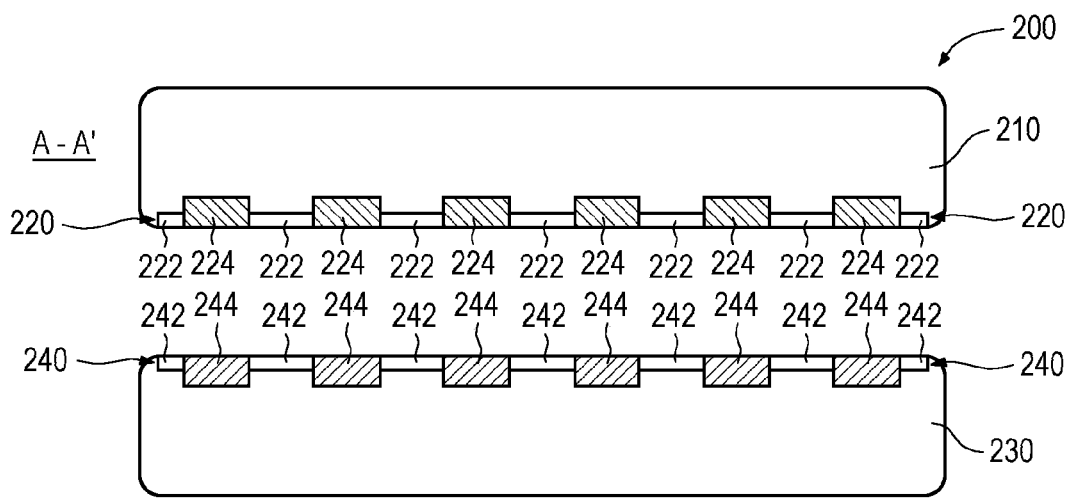
FIG. 2 is a schematic cross-sectional view of an exemplary substrate stack before bonding.

FIG. 2 illustrates a cross-section of a first substrate 210 having a first hybrid interface layer 220 and a second substrate 230 having a second hybrid interface layer 240. The substrates 210, 230 may be of the same material or of different materials. For example, the first substrate 210 and/or the second substrate 230 may comprise or be made of a semiconductor, sapphire, lithium niobate, lithium tantalate, or glass. For instance, Si, SiC, GaN, GaAs, Ge, SiGe are semiconductor materials which may be used to the first and/or second substrate 210, 230.

The first hybrid interface layer 220 comprises or is composed of a first insulator 222 and a first metal 224. Similarly, the second hybrid interface layer 240 comprises or is composed of a second insulator 242 and a second metal 244. Both, the first and second insulators 222, 242 and the first and second metals 224, 244 may be of one of the previously mentioned materials. In the example shown in FIG. 2, the first insulator 222 is, e.g., $SiO_2$, the first metal 224 is Cu, the second insulator 242 is SiN and the second metal 244 is Al. The first and second hybrid interface layers 220, 240 are arranged over the bulk material(s) of the first and second substrates 210 and 230, respectively.

The thickness of the first and/or second insulator 222, 242 may, e.g., be in a range between 0.1 μm or 0.5 μm and 2 μm and may, e.g., be about 1 μm. The thickness of the first and/or second metal 224, 244 may be equal to or greater than the thickness of the corresponding first or second insulator 222, 242, respectively. For example, the thickness of the first and/or second metal 224, 244 may be in a range between 0.1 μm or 0.5 μm or 1 μm and 3 μm and may, e.g., be about 2 μm. As mentioned before, the opposing surfaces of the first and second hybrid interface layers 220, 240 both have a very small roughness.

Further the pattern formed by the first insulator 222 and by the first metal 224 and the pattern formed by the second insulator 242 and by the second metal 244 are identical. Thus, after aligning the first and second substrates 210, 230, as shown in FIG. 2, the first insulator 222 and the second insulator 242 are facing each other with an alignment error (between the respective outlines of the insulator areas) as small as possible (e.g. equal to or smaller than 1 μm or 0.5 μm and, e.g., as small as 100 nm or more). Further, the first metal 224 and the second metal 244 are facing each other with an alignment error (between the respective outlines of the metal areas) as small as possible (e.g. equal to or smaller than 1 μm or 0.5 μm and, e.g., as small as 100 nm or more) to produce the electrically conductive first metal 224 to second metal 244 bond.

In other examples, the pattern formed by the first insulator 222 and by the first metal 224 and the pattern formed by the second insulator 242 and by the second metal 244 are different from each other. In this case, the first insulator 222 may at least partly overlap with the second metal 244 and/or the first metal 224 may at least partly overlap with the second insulator 242, and vice versa. However, also in the case of different patterns (i.e. layouts) of the first metal 224 and the second metal 244, the first and second metal 224, 244 may still at least partly overlap to produce the electrically conductive first metal 224 to second metal 244 bond.

Figure 3:
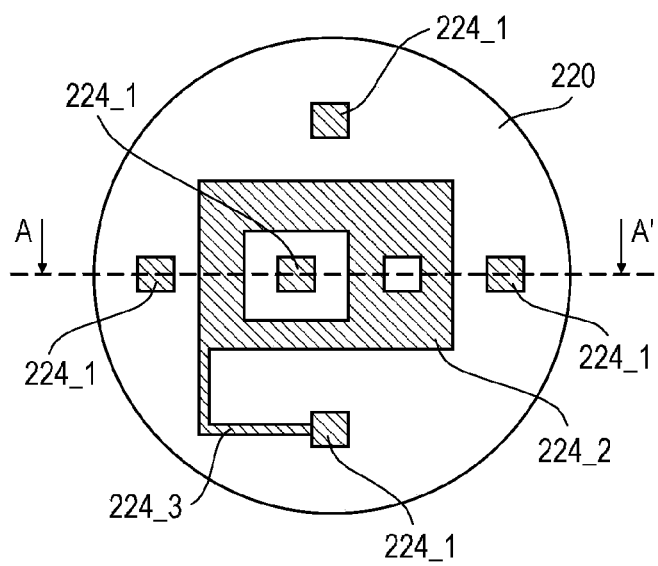
FIG. 3 is a schematic top view on each of the exemplary substrates of FIG. 2.

FIG. 3 illustrates a schematic top view on the first hybrid interface layer 220. As shown in FIG. 3, the first hybrid interface layer 220 may comprise first metal areas 224_1, 224_2, 224_3 which are of different shape. By way of example, the first metal areas 224_1 are shaped as rectangular or square electrodes, which may, e.g., have lateral dimensions of 2 μm to 30 μm. Further, the first metal 224 may be shaped to form large metal lands 224_2, which may have lateral dimensions of, e.g., between 100 μm to 10 mm. Further, metal lines 224_3 may be shaped from the first metal 224 which may have longitudinal dimensions of, e.g., about 50 μm to 10 mm and widths of, e.g., about 1 μm to 5 μm.

In particular, a ratio of metal area (in the example of FIG. 3 composed of metal electrodes 224_1, metal lands 224_2 and metal lines 2243) to insulator area (in the example of FIG. 3 the residual area of the first hybrid interface layer 220) may be equal to or greater than ⅒ or ⅕ or 1 or 5. In other words, no density rule for the metal-to-insulator proportion in the first hybrid interface layer 220 has to be followed.

The description of FIG. 3 analogously applies to the second hybrid interface layer 240. Reference is made to the above description for the sake of brevity. As mentioned before, the layouts of the first hybrid interface layer 220 and the second hybrid interface layer 240 may also be different.

Figure 4:
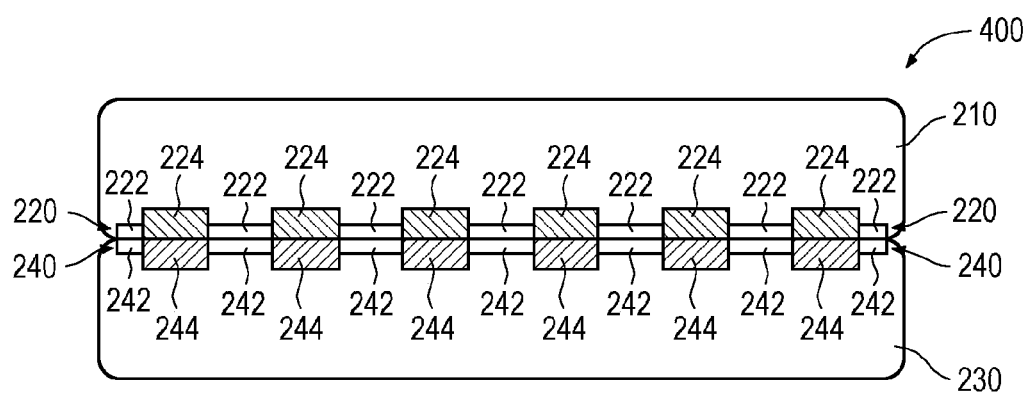
FIG. 4 is a schematic cross-sectional view of a bonded substrate stack comprising a first substrate bonded to a second substrate.

The first and second substrate 210, 230 are then placed on each other so that the surface-activated first hybrid interface layer 220 is brought into contact with the surface-activated second hybrid interface layer 240; see FIG. 4 and the description at S4_1 and S4_2 in FIG. 1B. The metal to metal bond (224-244) and the insulator to insulator bond (222-242) are created in one single bonding step. This bonding step may be assisted by the application of a (small) external pressure applied by the chucks on which the first and second substrates 210, 230 are held. If materials (first and second metals 224, 244, first and second insulators 222, 242 and/or first and second substrates 210, 230) of similar or equal CTE are used, a low temperature rise of up to e.g. 150° C. may optionally also be applied. However, the process may usually be carried out at room temperature. That way, a bonded substrate stack 400 is fabricated.

The bonded substrate stack 400 may then be tested, diced into individual devices and packaged. For instance, backside-illuminated (BSI) image sensors may be formed from the bonded substrate stack 400. As it is important to guarantee small distortion between the first and second hybrid interface layers 220, 240 in e.g. BSI devices, the process of bringing the first and second surface-activated hybrid interface layers 220, 240 together at initially a central point thereof as well as the aspect of using an inert gas atmosphere during this process may be of particular importance for e.g. BSI devices.

The following examples pertain to further aspects of the disclosure:

Example 1 is a method of manufacturing a bonded substrate stack, the method comprising: providing a first substrate having a first hybrid interface layer, the first hybrid interface layer comprising a first insulator and a first metal; providing a second substrate having a second hybrid interface layer, the second hybrid interface layer comprising a second insulator and a second metal; surface-activating the first hybrid interface layer and the second hybrid interface layer by particle bombardment configured to remove atoms of the first hybrid interface layer and atoms of the second hybrid interface layer to generate dangling bonds on the first hybrid interface layer and on the second hybrid interface layer; and bringing the surface-activated first hybrid interface layer and the surface-activated second hybrid interface layer into contact, thereby causing the dangling bonds of the first hybrid interface layer and the dangling bonds of the second hybrid interface layer to bond together to form the first insulator to second insulator bonds and/or first metal to second metal bonds.

In Example 2, the subject matter of Example 1 can optionally include wherein the kinetic energy of the particles used in the particle bombardment is equal to or greater than 3 keV.

In Example 3, the subject matter of Example 1 or 2 can optionally include wherein surface-activating is carried out by using neutral particles for particle bombardment or by using charged particles for particle bombardment.

In Example 4, the subject matter of any preceding Example can optionally include wherein the first insulator to second insulator bonds and the first metal to second metal bonds are produced at ambient temperature.

In Example 5, the subject matter of any preceding Example can optionally include wherein surface-activating is carried out at high vacuum or ultra-high vacuum.

In Example 6, the subject matter of any preceding Example can optionally include wherein bringing the surface-activated first hybrid interface layer and the surface-activated second hybrid interface layer into contact is carried out at high vacuum or ultra-high vacuum.

In Example 7, the subject matter of any Example 1 to 5 can optionally include wherein bringing the surface-activated first hybrid interface layer and the surface-activated second hybrid interface layer into contact is carried out in an inert gas atmosphere.

In Example 8, the subject matter of any preceding Example can optionally include wherein bringing the surface-activated first hybrid interface layer and the surface-activated second hybrid interface layer into contact comprises initially contacting together respective center of the hybrid interface layers.

In Example 9, the subject matter of any preceding Example can optionally include levelling the first hybrid interface layer and the second hybrid interface layer to a roughness of equal to or less than 1 nm or 0.5 nm root mean square.

In Example 10, the subject matter of any preceding Example can optionally include wherein a ratio of metal area to insulator area of the first hybrid interface layer and/or of the second hybrid interface layer is equal to or greater than 1/10 or 1/5 or 1 or 5.

In Example 11, the subject matter of any preceding Example can optionally include wherein the first metal and/or the second metal is selected from the group consisting of Cu, Pt, Ti, TiN, Al, AlCu, Mo, Ag, Au, W and/or wherein the first metal is different from the second metal.

In Example 12, the subject matter of any preceding Example can optionally include wherein the first insulator and/or the second insulator is selected from the group consisting of ceramics, $SiO_2$, SiN, $Al_2O_3$, AlN, AlScN, silicon oxynitride, borophosphosilicate glass, GaN, InGaN, AlGaN, AlInGaN, GaAs, InGaAs, AlGaAs, AlInGaAs, GaP, InGaP, AlGaP, AlInGaP, polymer and/or wherein the first insulator is different from the second insulator.

In Example 13, the subject matter of any preceding Example can optionally include wherein the first substrate and/or the second substrate is made of a material selected from the group consisting of a semiconductor, sapphire, lithium niobate, lithium tantalate, glass.

In Example 14, the subject matter of any preceding Example can optionally include wherein the first substrate and the second substrate are made of different materials.

Example 15 is a substrate stack comprising a first substrate having a first hybrid interface layer, the first hybrid interface layer comprising a first insulator and a first metal; a second substrate having a second hybrid interface layer, the second hybrid interface layer comprising a second insulator and a second metal; wherein the first hybrid interface layer is bonded to the second hybrid interface layer by surface-activated bonding featuring first insulator to second insulator bonds and first metal to second metal bonds, wherein surface activated bonding comprises: surface-activating the first hybrid interface layer and the second hybrid interface layer by particle bombardment configured to remove atoms of the first hybrid interface layer and atoms of the second hybrid interface layer to generate dangling bonds on the first hybrid interface layer and on the second hybrid interface layer; and bringing the surface-activated first hybrid interface layer and the surface-activated second hybrid interface layer into contact, thereby causing the dangling bonds of the first hybrid interface layer and the dangling bonds of the second hybrid interface layer to bond together to form the first insulator to second insulator bonds and/or the first metal to second metal bonds.

In Example 16, the subject matter of Example 15 can optionally include wherein at least one of the following conditions is met: the first metal is different from the second metal; the first insulator is different from the second insulator; the first substrate and the second substrate are made of different materials; and a ratio of metal area to insulator area of the first hybrid interface layer and/or of the second hybrid interface layer is equal to or greater than 1/10 or 1/5 or 1 or 5.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a bonded substrate stack, the method comprising:
   providing a first substrate having a first hybrid interface layer, the first hybrid interface layer comprising a first insulator and a first metal;
   providing a second substrate having a second hybrid interface layer, the second hybrid interface layer comprising a second insulator and a second metal;
   surface-activating the first hybrid interface layer and the second hybrid interface layer to generate dangling bonds on the first hybrid interface layer and on the second hybrid interface layer; and
   bringing the surface-activated first hybrid interface layer and the surface-activated second hybrid interface layer into contact, such that the dangling bonds of the first hybrid interface layer and the dangling bonds of the second hybrid interface layer bond together to form first insulator to second insulator bonds and/or first metal to second metal bonds.

2. The method of claim 1, wherein the first insulator to second insulator bonds and the first metal to second metal bonds are produced at ambient temperature.

3. The method of claim 1, wherein the surface-activating is carried out at high vacuum or ultra-high vacuum.

4. The method of claim 1, wherein bringing the surface-activated first hybrid interface layer and the surface-activated second hybrid interface layer into contact is carried out at high vacuum or ultra-high vacuum.

5. The method of claim 1, wherein bringing the surface-activated first hybrid interface layer and the surface-activated second hybrid interface layer into contact is carried out in an inert gas atmosphere.

6. The method of claim 1, wherein bringing the surface-activated first hybrid interface layer and the surface-activated second hybrid interface layer into contact comprises initially contacting together respective center of the hybrid interface layers.

7. The method of claim 1, further comprising:
levelling the first hybrid interface layer and the second hybrid interface layer to a roughness of equal to or less than 1 nm or 0.5 nm root mean square.

8. The method of claim 1, wherein a ratio of metal area to insulator area of the first hybrid interface layer and/or of the second hybrid interface layer is equal to or greater than $1/10$ or $1/5$ or 1 or 5.

9. The method of claim 1, wherein the first metal and/or the second metal is selected from the group consisting of Cu, Pt, Ti, TiN, Al, AlCu, Mo, Ag, Au, and W.

10. The method of claim 1, wherein the first metal is different from the second metal.

11. The method of claim 1, wherein the first insulator and/or the second insulator is selected from the group consisting of ceramics, $SiO_2$, SiN, $Al_2O_3$, AlN, AlScN, silicon oxynitride, borophosphosilicate glass, GaN, InGaN, AlGaN, AlInGaN, GaAs, InGaAs, AlGaAs, AlInGaAs, GaP, InGaP, AlGaP, AlInGaP, and polymer.

12. The method of claim 1, wherein the first insulator is different from the second insulator.

13. The method of claim 1, wherein the first substrate and/or the second substrate is made of a material selected from the group consisting of a semiconductor, sapphire, lithium niobate, lithium tantalate, and glass.

14. The method of claim 1, wherein the first substrate and the second substrate are made of different materials.

15. A substrate stack, comprising:
a first substrate having a first hybrid interface layer, the first hybrid interface layer comprising a first insulator and a first metal; and
a second substrate having a second hybrid interface layer, the second hybrid interface layer comprising a second insulator and a second metal,
wherein the first hybrid interface layer is bonded to the second hybrid interface layer by surface-activated bonding featuring first insulator to second insulator bonds and first metal to second metal bonds,
wherein the surface activated bonding comprises:
the first hybrid interface layer and the second hybrid interface layer being surface-activated to generate dangling bonds on the first hybrid interface layer and on the second hybrid interface layer; and
the surface-activated first hybrid interface layer and the surface-activated second hybrid interface layer being brought into contact, such that the dangling bonds of the first hybrid interface layer and the dangling bonds of the second hybrid interface layer to bond together to form the first insulator to second insulator bonds and/or the first metal to second metal bonds.

16. The substrate stack of claim 15, wherein the first metal is different from the second metal.

17. The substrate stack of claim 15, wherein the first insulator is different from the second insulator.

18. The substrate stack of claim 15, wherein the first substrate and the second substrate are made of different materials.

19. The substrate stack of claim 15, wherein a ratio of metal area to insulator area of the first hybrid interface layer and/or of the second hybrid interface layer is equal to or greater than $1/10$ or $1/5$ or 1 or 5.

* * * * *